United States Patent
Park et al.

(10) Patent No.: US 6,743,712 B2
(45) Date of Patent: Jun. 1, 2004

(54) METHOD OF MAKING A SEMICONDUCTOR DEVICE BY FORMING A MASKING LAYER WITH A TAPERED ETCH PROFILE

(75) Inventors: Hyun-Mog Park, Beaverton, OR (US); Jihperng Leu, Portland, OR (US); Chih-I Wu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/195,032

(22) Filed: Jul. 12, 2002

(65) Prior Publication Data

US 2004/0009662 A1 Jan. 15, 2004

(51) Int. Cl.⁷ ............................................. H01L 21/4763
(52) U.S. Cl. ................... 438/637; 438/638; 438/640; 438/666; 438/668; 438/701; 438/713; 438/736; 438/737; 438/738; 438/947
(58) Field of Search ................... 438/622, 624, 438/636–638, 640, 666, 700–701, 713, 723, 725, 734, 737–738, 743, 736, 947

(56) References Cited

U.S. PATENT DOCUMENTS

| 5,913,148 | A  | * | 6/1999 | Hills ........................... 438/701 |
| 6,191,028 | B1 | * | 2/2001 | Huang et al. ................ 438/637 |
| 6,387,798 | B1 | * | 5/2002 | Loke et al. .................. 438/640 |
| 6,503,829 | B2 | * | 1/2003 | Kim et al. ................... 438/637 |
| 6,518,174 | B2 | * | 2/2003 | Annapragada et al. ...... 438/700 |

* cited by examiner

*Primary Examiner*—Lynne Gurley
(74) *Attorney, Agent, or Firm*—Mark V. Seeley

(57) ABSTRACT

A method for making a semiconductor device is described. That method includes forming a sacrificial layer on a substrate, then forming a layer of photoresist on the sacrificial layer. After the photoresist layer is patterned, to form a patterned photoresist layer that has a first opening, part of the sacrificial layer is removed to generate an etched sacrificial layer that has a second opening that is substantially smaller than the first opening.

8 Claims, 1 Drawing Sheet

METHOD OF MAKING A SEMICONDUCTOR DEVICE BY FORMING A MASKING LAYER WITH A TAPERED ETCH PROFILE

FIELD OF THE INVENTION

The present invention relates to a method for making semiconductor devices, particularly those that include fine feature structures.

BACKGROUND OF THE INVENTION

To enable semiconductor devices to continue to scale downward, a commercially viable technique for patterning fine feature structures that are less than 100 nm wide will be required. Current optical lithography techniques (e.g., those for defining vias and trenches when forming a device's interconnect) may not enable 100 nm features. Although 193 nm lithography may facilitate 120 nm patterns, variants of that technology that enable sub 100 nm features are not yet commercially available. Similarly, although the RELACS™ process may serve to reduce via and trench size, that process may not currently enable sub 100 nm structures. (RELACS™ is a trademark of the Mitsubishi Electronic Corporation. Materials for use in the RELACS™ process are available from the AZ Electronic Materials division of Clariant International, Ltd.) Likewise, reducing via size by applying a special chemical treatment to a previously patterned photoresist layer to shrink the photoresist opening, prior to etching the via, does not appear to offer an acceptable process for defining sub 100 nm features.

Other proposed methods for reaching 100 nm either require using sophisticated mask technology (e.g., phase-shift masks) or remain in the experimental stage (e.g., 157 nm optical lithography, EUV lithography, x-ray proximity lithography, and electron beam technology). Using advanced mask technology can significantly increase cost, and experimental methods are not yet practical for high volume manufacturing.

Accordingly, there is a need for a process for patterning fine feature structures, when making semiconductor devices. There is a need for such a process that enables sub 100 nm patterns to be formed using conventional lithography materials, tools and procedures. The present invention provides such a process.

DETAILED DESCRIPTION OF THE PRESENT INVENTION

Figure 1A:
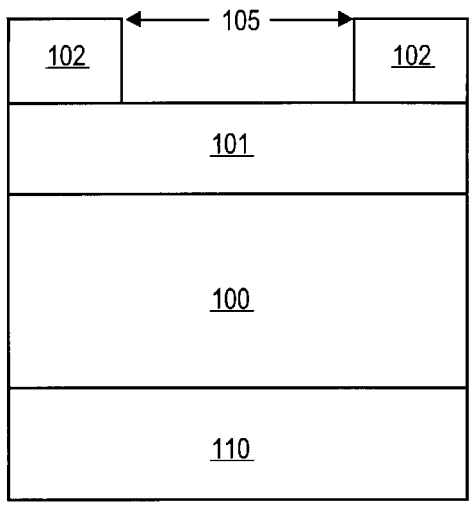
FIGS. 1a–1d represent cross-sections of structures that may result when certain steps are used to carry out an embodiment of the method of the present invention.

A method for making a semiconductor device is described. In that method, a sacrificial layer is formed on a substrate, and a layer of photoresist is formed on the sacrificial layer. The photoresist layer is then patterned to form a patterned photoresist layer that has a first opening. Part of the sacrificial layer is removed to generate an etched sacrificial layer that has a second opening that is substantially smaller than the first opening.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In an embodiment of the method of the present invention, as illustrated by FIGS. 1a–1d, sacrificial layer 101 is formed on a substrate. The substrate may include any device or structure that may be formed when making a semiconductor. In a preferred embodiment, sacrificial layer 101 is formed on dielectric layer 100, which is formed on substrate 110. In that preferred embodiment (where the substrate upon which sacrificial layer 101 is formed includes substrate 110 and dielectric layer 101), substrate 110 may include a conductive layer, e.g., one comprising copper, upon which dielectric layer 100 is formed.

When substrate 110 includes such a conductive layer, it may be necessary to etch a via through dielectric layer 100, which will be subsequently filled with copper or another conductive material. That via can couple that conductive layer to a second conductive layer, which fills a trench etched into dielectric layer 100 or etched into a second dielectric layer. Such a trench and via combination may be formed using single or dual damascene processes, as is well known to those skilled in the art. Dielectric layer 100 may comprise any material that may be used to form an insulating layer for a semiconductor device. For example, dielectric layer 100 may comprise silicon dioxide, or a material that has a lower dielectric constant—e.g., a fluorine or carbon doped oxide or an organic polymer. Although a few examples of materials that may be used to form dielectric layer 100 are described here, that layer may be made from many other types of materials, as will be apparent to those skilled in the art. Dielectric layer 100 may be formed on substrate 110 using various deposition methods, e.g., conventional chemical vapor deposition or spin-on coating processes. Dielectric layer 100 preferably is between about 50 nm and about 1,000 nm thick, when deposited.

Sacrificial layer 101 comprises a material that may perform a masking function. In a preferred embodiment, sacrificial layer 101 comprises a spin-on-glass ("SOG") or a spin-on-polymer ("SOP"), which may be etched selectively with respect to dielectric layer 100. Such an SOG or SOP may be deposited onto dielectric layer 100 by spin coating the selected material onto that layer, using conventional process steps. Whether an SOG or SOP material is used for sacrificial layer 101 may depend upon the type of material used to form dielectric layer 100. Sacrificial layer 101 preferably is between about 50 nm and about 250 nm thick.

If sacrificial layer 101 is transparent, it may be difficult to control photoresist patterning and uniformity because of substrate reflectivity and reflectivity variation across devices. The resulting distortion can become more significant as the defined critical dimensions decrease. To reduce substrate reflectivity, sacrificial layer 101 preferably comprises a material that may serve as an anti-reflective coating ("ARC") as well as a masking layer. In a preferred embodiment, sacrificial layer 101 comprises a sacrificial light absorbing material ("SLAM") that includes a dyed SOG.

Preferably, the quantity and type of light absorbing dye, which is added to the SOG, should enable appreciable absorption of light at the wavelength used to expose the photoresist to pattern it. For example, the dye type and amount included in sacrificial layer 101 may be selected and tuned to absorb i-line (e.g., 365 nm), deep ultraviolet (e.g., 248 nm and 193 nm), or even shorter, wavelengths. Both Honeywell, Inc., and Tokyo Ohka Kogyo Co. Ltd., have made dyed SOG materials that may be used to form sacrificial layer 101.

After forming sacrificial layer 101 on dielectric layer 100, a photoresist layer 102 is patterned on top of it to define a region to be etched into dielectric layer 100. Photoresist layer 102 may be patterned using conventional photolithographic techniques, such as masking the layer of photoresist, exposing the masked layer to light, then developing the unexposed portions. When, for example, a 248 nm DUV process is used to pattern the photoresist, the diameter of first opening 105 preferably will be less than about 220 nm, and more preferably between about 180 nm and about 210 nm. The resulting structure is shown in FIG. 1a.

When a 248 nm DUV process is used to pattern the photoresist, the method of the present invention may enable a fine feature structure to be defined that has a diameter that is less than about 100 nm. If etch bias exceeding 110 nm is achieved, such a process may form 70 nm, or smaller, features. Because 193 nm DUV processes may form 120 to 130 nm openings in photoresist, the method of the present invention may enable features with a critical dimension of between about 20 and about 30 nm to be formed, when a 193 nm DUV process is used to pattern the photoresist. Although the embodiment described above does not specify forming a hard mask on top of sacrificial layer 101 prior to applying the photoresist, such a hard mask may be desirable when using certain lithographic techniques and certain types of material to form sacrificial layer 101.

The method of the present invention enables an etched region to be formed within dielectric layer 100 that has a critical dimension that is significantly smaller than first opening 105. To produce an etched region with a reduced critical dimension, sacrificial layer 101 is etched to generate an etched sacrificial layer that has a second opening 104 that is substantially smaller than first opening 105. This may be accomplished by etching the exposed portion of sacrificial layer 101 using an etch process that yields a tapered etch profile, as FIG. 1b illustrates.

A low power dry plasma etch process, which is highly selective to dielectric layer 100, when applied to sacrificial layer 101 may produce such a tapered etch profile. Such a process relies upon low ion bombardment energy to remove portions of sacrificial layer 101. By using a low power plasma etch process to etch sacrificial layer 101, the amount of sacrificial layer 101 that is removed may vary with the depth of that layer. This can yield a graded structure that has a second opening 104 that is significantly smaller than first opening 105. Such a graded structure may result when sacrificial layer 101 is exposed to a plasma, which may be generated within a conventional plasma etch reactor, that is derived from a fluorocarbon chemistry, e.g., one based on $C_4F_8$. To obtain the desired etch profile, the plasma etch reactor should be operated below 1,000 watts, and more preferably between about 300 and 1,000 watts, and the gas flow rate for the $C_4F_8$ component should lie between about 10 and about 20 sccm.

Such a plasma etch process may produce a second opening 104 with a diameter that is less than about 100 nm. The grade of the tapered etch profile may be 60 degrees or higher. The size of second opening 104 will depend upon the thickness of sacrificial layer 101, and the etch process conditions (e.g., the power and pressure applied, the gas chemistry and flow rate and the substrate temperature), as etch process parameters will affect the slope of the etch profile. For a given set of etch process parameters, and a given size of first opening 105, the critical dimension can be changed by varying the thickness of sacrificial layer 101. In this regard, increasing layer 101's thickness will decrease that critical dimension—everything else being equal.

Figure 1B:
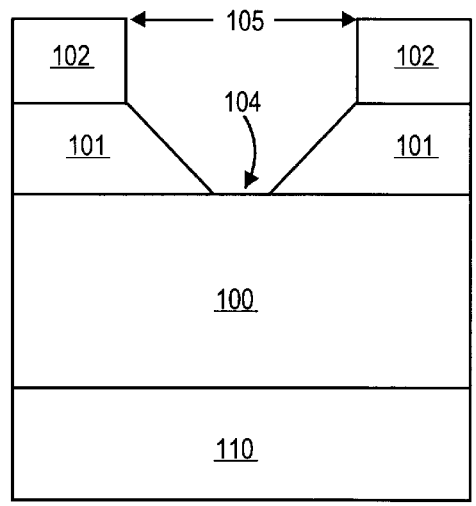
Figure 2A:
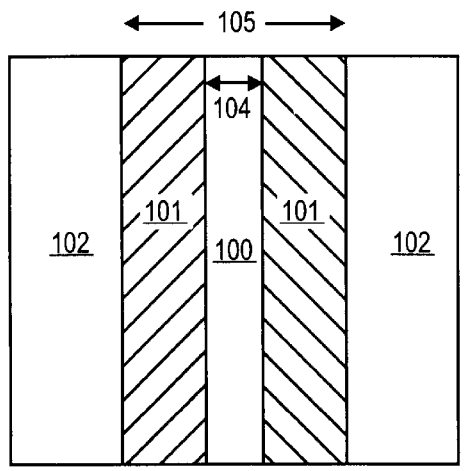
FIGS. 2a–2b represent top views of the FIG. 1b structure, which illustrate use of the method of the present invention to define a trench and a via, respectively.
Figure 2B:
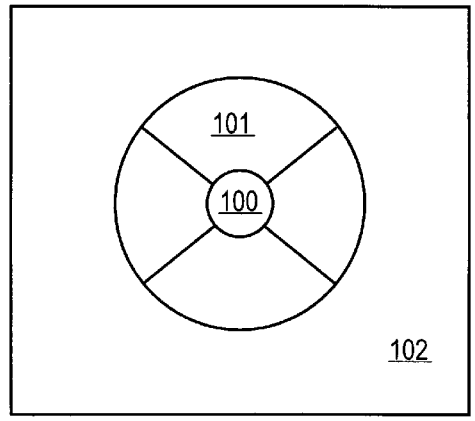

FIGS. 2a–2b represent top views of the FIG. 1b structure, which illustrate use of the method of the present invention to define a trench and a via, respectively. As illustrated in FIG. 2a, the tapered etch profile for sacrificial layer 101 may define a trench that will be formed by removing part of dielectric layer 100, where exposed. Note that opening 104, which exposes the portion of dielectric layer 100 that will be etched to form the trench, has a much smaller diameter than first opening 105. FIG. 2b represents use of the method of the present invention to define a via that will be formed through dielectric layer 100, where exposed at the bottom of sacrificial layer 101's tapered etch profile. As when defining the trench, the diameter of the exposed portion of dielectric layer 100 is significantly smaller than the diameter of first opening 105.

Figure 1C:
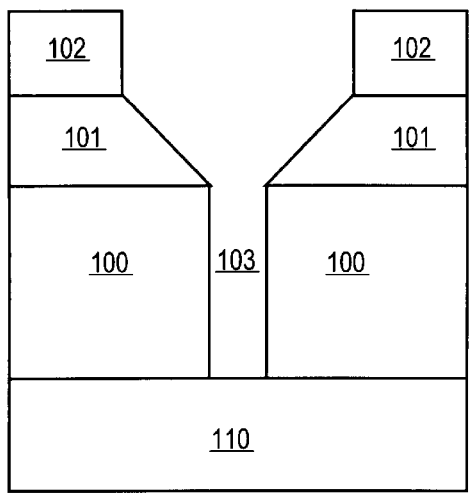

In this embodiment, after sacrificial layer 101 has been etched, etched region 103 is formed through dielectric layer 100 to generate the structure represented by FIG. 1c. Conventional process steps for etching through a dielectric layer may be used to form etched region 103, e.g., a conventional anisotropic dry oxide etch process. The process used to form etched region 103 in dielectric layer 100 may take place in the same plasma etch reactor as the process used to etch sacrificial layer 101. When performing these two process steps in situ, the gases used to etch sacrificial layer 101 are purged after that layer is etched. The gas mixture for etching dielectric layer 100 is then introduced into the reactor, which is operated under the appropriate conditions to etch dielectric layer 100. The process used to form etched region 103 should have a high etch selectivity to sacrificial layer 101 to ensure that significant portions of sacrificial layer 101 are not removed when etched region 103 is formed within dielectric layer 100.

Figure 1D:
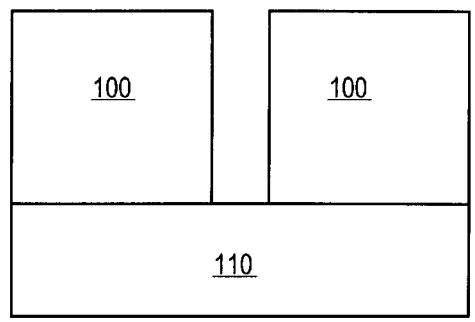

Appropriate photoresist removal and cleaning steps may follow to produce the structure shown in FIG. 1d. For example, when dielectric layer 100 comprises $SiO_2$ or SiOF, an ashing step may be used to remove the remainder of photoresist layer 102, while a conventional wet etch process can remove the remainder of sacrificial layer 101. Etched region 103 may be cleaned, at the same time the sacrificial layer is removed, by using a conventional BOE wet etch process. Sacrificial layer 101 should have a wet etch rate that is significantly faster than the wet etch rate for dielectric layer 100 to enable removal of sacrificial layer 101 from dielectric layer 100 without removing significant amounts of dielectric layer 100. As an alternative to this sequence of process steps for removing the photoresist and sacrificial layer 101, those materials may be removed simultaneously using an appropriate chemical treatment.

The degree to which the method of the present invention facilitates critical dimension reduction was demonstrated by the following experiment. A 220 nm thick layer of a sacrificial light absorbing material ("SLAM") was deposited on a SiOF dielectric layer. That SLAM layer was then covered with a layer of photoresist, and a 248 nm DUV process was used to form a 190 nm opening in the photoresist. The device was then placed in a plasma etch reactor and subjected to a low power dry plasma etch process, which exposed the SLAM layer to a plasma derived from a $C_4F_8$ containing gas stream. The $C_4F_8$ component of that gas stream was introduced into the reactor at a flow rate of between about 10 and about 20 sccm and the reactor was operated at between about 350 and about 500 watts. As a result, a tapered etch profile was generated in the SLAM layer. The SiOF layer was then plasma etched using a conventional oxide etch chemistry to form a trench. After removing the photoresist and the SLAM layer, the trench was found to have a critical dimension of about 80 nm, which was 110 nm smaller than the 190 nm opening in the photoresist.

The method of the present invention may be used to define vias and trenches with critical dimensions that are substantially smaller than those permitted by conventional lithographic processes. By forming a tapered etch profile within a sacrificial layer that has a 100 nm, or greater, etch bias from the region that an overlying photoresist layer exposes, it may be possible to generate 100 nm, and even smaller, features. Using this method, such fine feature structures may be created with commercially available optical lithography materials, tools and processes.

Although the present invention may be used when forming vias and/or trenches, which are then filled with a conductive material or materials to create an interconnect for a semiconductor device, the invention is not limited to that particular application. Any process that forms within a sacrificial layer an opening that is smaller than the opening formed in an overlying layer of photoresist, to enable a structure of reduced dimension to be formed in an underlying substrate, falls within the spirit and scope of the present invention.

Features shown in the above referenced drawings are not intended to be drawn to scale, nor are they intended to be shown in precise positional relationship. Additional steps that may be included in the above described method have been omitted as they are not useful to describe aspects of the present invention. Although the foregoing description has specified certain steps and materials that may be used in such a method to make a semiconductor device, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of making a semiconductor device comprising:

forming a dielectric layer on a substrate;

forming a sacrificial layer on the dielectric layer;

forming on the sacrificial layer a layer of photoresist;

patterning the photoresist layer;

removing part of the sacrificial layer to generate an etched sacrificial layer that has a tapered etch profile;

etching the dielectric layer where located below the removed part of the sacrificial layer; and removing the etched sacrificial layer after the dielectric layer is etched wherein the patterned photoresist layer has a first opening that is less than about 220 nanometers in diameter and wherein the etched sacrificial layer has a second opening that is smaller than the first opening and that is less than about 100 nanometers in diameter.

2. The method of claim 1 wherein the sacrificial layer serves as an antireflective coating and comprises a dyed spin-on-glass or dyed spin-on-polymer.

3. The method of claim 2 wherein part of the sacrificial layer is removed using a plasma etch process that exposes the sacrificial layer to a plasma generated from a fluorocarbon gas, while operating a plasma etch reactor at less than about 1,000 watts.

4. The method of claim 3 wherein the dielectric layer is etched using an etch process that is selective to the etched sacrificial layer.

5. A method of making a semiconductor device comprising:

forming a dielectric layer on a substrate;

forming a sacrificial layer on the dielectric layer, the sacrificial layer serving as an antireflective coating and comprising a dyed spin-on-glass or dyed spin-on-polymer;

forming on the sacrificial layer a layer of photoresist;

patterning the photoresist layer, the patterned photoresist layer having a first opening that exposes the sacrificial layer, the first opening having a diameter that is less than about 220 nanometers;

removing part of the sacrificial layer to generate an etched sacrificial layer that has a tapered etch profile, the etched sacrificial layer having a second opening that has a diameter that is substantially smaller than the diameter of the first opening and that is less than about 100 nanometers;

etching the dielectric layer where located below the second opening to form an etched region within the dielectric layer; and removing the etched sacrificial layer after the dielectric layer is etched.

6. The method of claim 5 wherein part of the sacrificial layer is removed using a plasma etch process that exposes the sacrificial layer to a plasma generated from a fluorocarbon gas, while operating a plasma etch reactor at less than about 1,000 watts, wherein the diameter of the first opening is at least about 100 nanometers greater than the diameter of the second opening, and further comprising filling the etched region with a conductive material to form a via that will couple a first conductive layer with a second conductive layer.

7. The method of claim 5 wherein the etched region comprises a trench formed within the dielectric layer, and further comprising filling the trench with a conductive material.

8. The method of claim 5 wherein the sacrificial layer is between about 50 nanometers and about 250 nanometers thick.

* * * * *